US008766258B1

(12) United States Patent
Dimitrakopoulos et al.

(10) Patent No.: US 8,766,258 B1
(45) Date of Patent: Jul. 1, 2014

(54) AUTHENTICATION USING GRAPHENE BASED DEVICES AS PHYSICAL UNCLONABLE FUNCTIONS

(71) Applicant: International Business Machines Corporation, Armonk, NY (US)

(72) Inventors: Christos D. Dimitrakopoulos, Baldwin Place, NY (US); Dirk Pfeiffer, Croton on Hudson, NY (US); Joshua T. Smith, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/712,455

(22) Filed: Dec. 12, 2012

(51) Int. Cl.
*H01L 23/58* (2006.01)
*H01L 21/66* (2006.01)

(52) U.S. Cl.
USPC .............................. 257/48; 438/17

(58) Field of Classification Search
USPC .............. 438/10–18, 82, 725; 257/48, 643
See application file for complete search history.

(56) References Cited

U.S. PATENT DOCUMENTS

| 7,682,523 | B2 | 3/2010 | Weisman |
| 7,719,318 | B1 | 5/2010 | Nordquist |
| 2008/0195337 | A1 | 8/2008 | Agarwal et al. |
| 2009/0206821 | A1 | 8/2009 | Meterelliyoz et al. |
| 2010/0050901 | A1 | 3/2010 | Biris |
| 2011/0059599 | A1 | 3/2011 | Ward |
| 2011/0163290 | A1 | 7/2011 | Rueckes |
| 2012/0080658 | A1 | 4/2012 | Yang |
| 2012/0141799 | A1 | 6/2012 | Kub |
| 2013/0065034 | A1* | 3/2013 | Muramatsu .................. 428/213 |

FOREIGN PATENT DOCUMENTS

WO WO/2012/038453 3/2012

OTHER PUBLICATIONS

S. Lee et al., "Laser-Synthesized Epitaxial Graphene", American Chemical Society, NANO, Published Dec. 1, 2010, vol. 4 No. 12, pp. 7524-7530.
J. Robinson et al., "Epitaxial Graphene Materials Integration: Effects of Dielectric Overlayers on Structural and Electronic Properties", American Chemical Society, NANO, Published Apr. 19, 2010, vol. 4 No. 5, pp. 2667-2672.
B. Fallahazad et al., "Scaling of Al2O3 Dielectric for Graphene Field-Effect Transistors" American Institute of Physics , Applied Physics Letters, Published on line Mar. 1, 2012, pp. 093112-1-093112-4.
W. Zhu, et al. "Silicon Nitride Gare Dielectrics and Band Gap Engineering in Graphene Layers" 2010 American Chemical Society, NANO Letters, pp. 3572-3576.

(Continued)

*Primary Examiner* — Calvin Lee
(74) *Attorney, Agent, or Firm* — Louis Percello

(57) ABSTRACT

The present disclosure relates to secure devices having a physical unclonable function and methods of manufacturing such secure devices. One device includes at least one graphene layer representing a physical unclonable function and a measurement circuit for measuring at least one property of the at least one graphene layer. Another device includes at least a first graphene layer and a second graphene layer representing a physical unclonable function, where one of the graphene layers has been subjected to a variability enhancement such that a measurable property is different for each of the layers. A method includes providing a substrate for a secure device and providing at least one graphene layer on the substrate, the at least one graphene layer representing a physical unclonable function. The providing of the at least one graphene layer includes applying at least one variability enhancement to the at least one graphene layer.

20 Claims, 4 Drawing Sheets

(56) References Cited

OTHER PUBLICATIONS

D. Farmer et al. "Utilization of a Buffered Dielectric to Achieve High Field-Effect Carrier Mobility in Graphene Transistors" 2009 American Chemical Society, NANO Letters, 2009 vol. 9, No. 12. pp. 4474-4478.

M. Weaver, "Organic Light-Emitting Devices with extended Operating Lifetimes on Plastic Substrates" 2002 American Institute of Physics, Applied Physics Letters, Oct. 14, 2002, pp. 2929-2931.

Y. Lin et al. "Operation of Graphene Transistors at Gigahertz Frequencies" American Chemical Society, NANO Letters, 2009 vol. 9, No. 1. pp. 422-426.

X. Wang, et al., "Atomic Layer Deposition of Metal Oxides on Pristine and Functionalized Graphene" Journal of the American Chemical Society 2008, vol. 130, No. 26. pp. 8152-8153.

B. Lee at al., "Conformal Al2O3 Dielectric Layer Deposited by Atomic Layer Depostion for Graphene-Based Nanoelectronics" American Institute of Physics, Applied Physics Letters, Published on line May 20, 2008, pp. 203102-1-203102-3.

J. Kang et al., Efficient Transfer of Large-Area Graphene Films onto Rigid Substrates by Hot Pressing American Chemical Society, ACS NANO, received and reviewed Mar. 19, 2012 and accepted May 27, 2012. pp. A-F.

M. Levendorf et al., "Transfer-Free Batch Fabrication of Single Layer Graphene Transistors" NANO Letters, 2009 vol. 9, No. 12. pp. 4479-4483.

C. Riedl et al., Quasi-Free Standing Graphene on SiC by Hydrogen Intercalation arXiv:0911.1953v1 Physical Review Letters 103, 246804, Nov. 10, 2009, pp. 1-4.

S. Hertel et al., "Tailoring the Graphene/Silicon Carbide Interface for Monolithic Wafer-Scale Electronics" Nature Communications Jul. 17, 2012, pp. 1-6.

G. Edward Suh et al., "Physical Unclonable Functions for Device Authentication and Secret Key Generation" DAC 2007, Jun. 4-8 2007, Consists of 6 unnumbered pages.

J. Han at al., "Self-Passivation of Transparent Single-Walled Carbon Nanotube Films on Plastic Substrates by Microwave-Induced Rapid Nanowelding" American Institute of Physics, Apr. 20, 2012, pp. 163120-1-163120-4.

* cited by examiner

AUTHENTICATION USING GRAPHENE BASED DEVICES AS PHYSICAL UNCLONABLE FUNCTIONS

FIELD OF THE DISCLOSURE

The present disclosure relates to device authentication, and more particularly to physical unclonable functions for integrated circuits.

BACKGROUND OF THE DISCLOSURE

Hardware based "Root of Trust" is a fundamental building block for any secure computing system. Key elements of secure computing require authentication, sending data to an authorized source, and/or loading data onto a designated device. In general, cryptographic keys in binary code form the basis of securing data and bit streams. Typically, such cryptographic keys are stored in non-volatile memory and are present on an integrated circuit (IC) at all times. If an attacker can extract the key from a device, the entire foundation for secure computing is in jeopardy. For example, an attacker with physical access to the device can delayer a chip, and read out the stored code based on the state of the transistors. Thus, securing cryptographic keys requires anti-tamper technologies, which may be relatively expensive and may therefore not be suitable for implementation in various devices like field programmable gate arrays (FPGAs), mobile devices, and sensors.

SUMMARY OF THE DISCLOSURE

Embodiments of the present disclosure disclose secure devices and methods for manufacturing such devices having physical unclonable functions. For example, in one embodiment a secure device having a physical unclonable function includes at least one graphene layer representing the physical unclonable function and a measurement circuit for measuring at least one property of the at least one graphene layer. Similarly, in another embodiment a secure device having a physical unclonable function includes a substrate and at least one graphene layer on the substrate representing the physical unclonable function, the graphene layer having been subjected to at least one variability enhancement. Similarly, in another embodiment a secure device having a physical unclonable function includes a first graphene layer and a second graphene layer representing a physical unclonable function, where at least one of the first graphene layer and the second graphene layer has been subjected to a variability enhancement such that a measurable property is different for each of the first graphene layer and the second graphene layer.

In a further embodiment, a method of manufacturing a secure device having a physical unclonable function includes providing a first graphene layer, providing a second graphene layer and applying a variability enhancement to at least one of the first graphene layer and the second graphene layer such that a measurable property is different for each of the first graphene layer and the second graphene layer. The physical unclonable function is represented by at least the first and second graphene layers. In still another embodiment, a method of manufacturing a secure device having a physical unclonable function includes providing an integrated circuit comprising at least one graphene layer and including a measurement circuit in the integrated circuit that is configured to measure at least one property of the at least one graphene layer for authenticating the secure device. The at least one graphene layer represents the physical unclonable function.

BRIEF DESCRIPTION OF THE DRAWINGS

The teachings of the present disclosure can be readily understood by considering the following detailed description in conjunction with the accompanying drawings, in which.

To facilitate understanding, identical reference numerals have been used, where possible, to designate identical elements that are common to the Figures.

DETAILED DESCRIPTION

Figure 1:
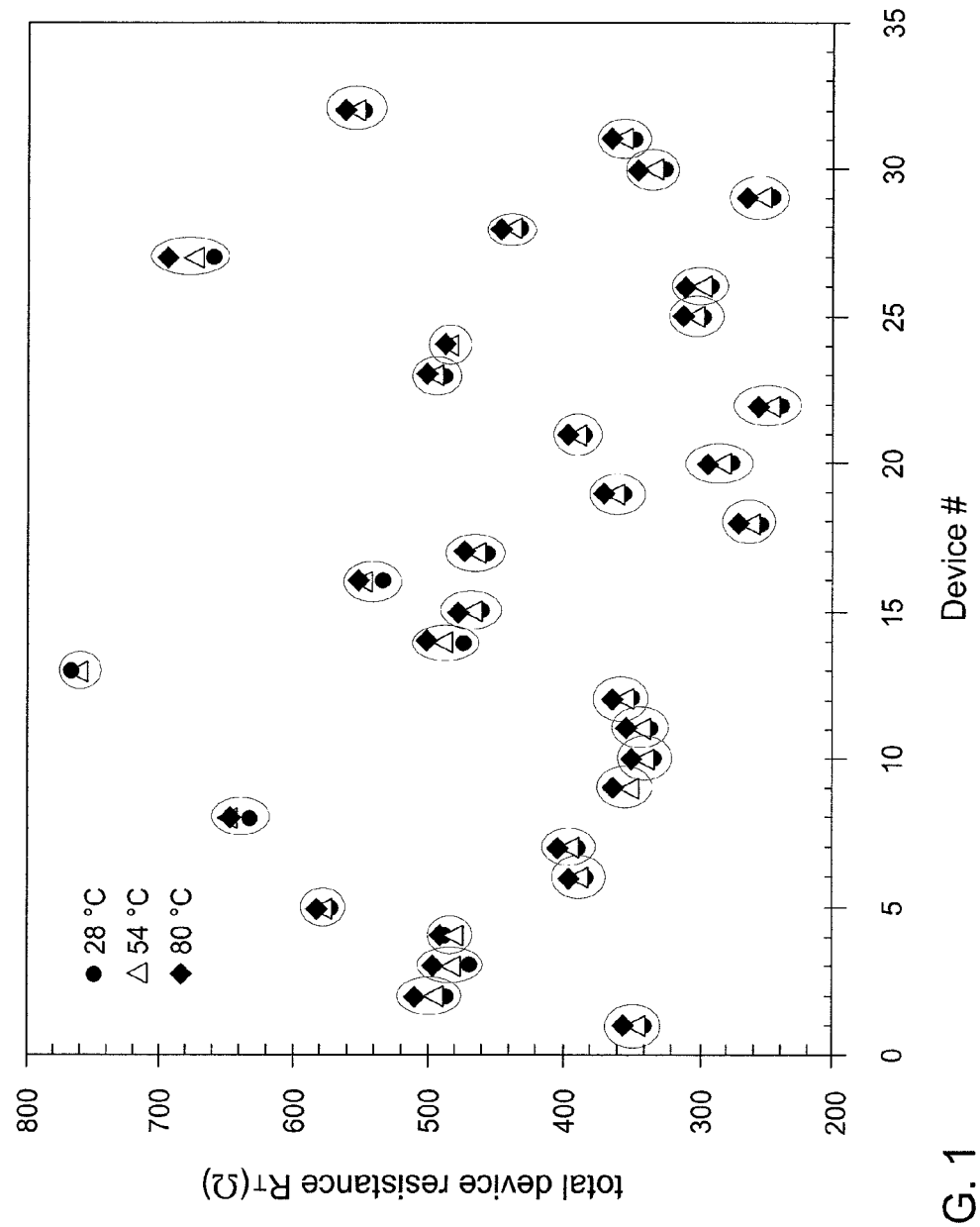
FIG. 1 illustrates a graph of experimental results for measuring properties of exemplary graphene devices, according to embodiments of the present disclosure.

Embodiments of the present disclosure disclose secure devices having unique physical properties, or physical unclonable functions (PUFs), for authentication and key generation with several advantages. For example, an exemplary device may include a substrate, die, or integrated circuit, having an array of one or more graphene layers that is used as a physical unclonable function. Each of the graphene layers may be situated between a source and a drain region to form various structures such as a resistor, a capacitor, a transistor, a diode, a logic gate and so forth. As described herein, such structures are generally referred to as graphene devices or graphene-based physical unclonable functions. Exemplary secure devices may further include a measurement circuit for measuring at least one property of each of the graphene devices and/or graphene layers for deriving PUF values, which form a cryptographic key for authenticating the secure device.

One of the principles behind a PUF is that the cryptographic key(s) are not stored in binary form when the chip is powered down but are hidden in form of unique physical analog identifiers within the hardware so that the code can only be executed on a designated authorized uncompromised IC. Thus, when a circuit is turned on, the areas of the chip can be measured and the analog values converted into a binary code. However, if the chip is turned off, the binary code is not stored in any memory, but is implicit in the properties of the chip. Prior approaches to using physical unclonable functions for authentication and key generation focus on device structures that have been optimized during manufacturing to have reduced variability, since the usual intent is high performance and reproducibility. However, if an array of device(s) used to provide a physical unclonable function has a narrow variability range close to a threshold of a measurement device used to compute a binary code from the physical unclonable function, any slight change over time and temperature may result in bit errors. For instance, a threshold can be applied to analog values representing a physical unclonable function in order to convert the signature to a binary representation. In this way, a key, such as in the form of a binary code, can be derived from the signature, the key comprising an identifier that is unique to the device and that can be used for authenticating the device. However, it may be a particular problem when a particular analog value is close to a threshold. If the analog value changes, even slightly, then the signature can change. For instance, the value may be read as a one, whereas it should be read as a zero. It is possible to deal with this problem using bit error correction. However, this may reduce the security of the code because the greater redundancy and error tolerance in the code, the less reliable it is as a security mechanism.

In contrast to the foregoing, various embodiments of the present disclosure provide a graphene-based physical unclonable function having measurable properties, such as a resistance, which remain stable over time, temperature and/or other changing conditions. For example, one embodiment uses one or more graphene devices as a PUF to generate widely varied resistance(s), capacitance(s), voltage response(s), etc. where these values remain stable over time and under various temperature conditions. Variation in graphene properties is pronounced even under the most controlled fabrication conditions, owing to its two-dimensional, all-surface nature. Once transferred onto a substrate surface or exposed to air, a number of molecules readily interact with or adsorb to graphene, altering its electrical properties in a substantially random way. Thus, in one embodiment stability is imparted to one or more graphene layers by use of a passivation layer. By passivating the graphene with an appropriate material, the physical attributes associated with each individual graphene device, and hence the PUF "signature" values, are preserved, enabling long-term stability. Additionally, processes that would generally be used to tamper with such a device(s), such as scanning electron microscopy (SEM), can easily alter the properties of or destroy graphene, even if passivated.

It has been demonstrated that unpassivated graphene devices exhibit a systematic drop in resistance with increasing temperature. For instance, in one embodiment an increase in temperature from 27 degrees Celsius to 54 degrees Celsius resulted in an average resistance drop of 14 percent. A further increase in temperature to 80 degrees Celsius resulted in an additional three percent drop in resistance. The decrease in resistance appears to be caused by the loss of physisorbed molecules on the graphene surface. In one embodiment, graphene devices subjected to a temperature pre-anneal in vacuum (e.g., 125 degrees Celsius for three hours) prior to the measurement without breaking vacuum exhibited a much narrower range of temperature variation. In particular, less than five percent variation in resistance was found over the temperature range of 29 degrees to 80 degrees Celsius. On the other hand, the same set of graphene devices retested after one week stored in a nitrogen-rich environment exhibited an average increase in resistance of 87 ohms per device. However, when a similar experiment was performed using a set of passivated graphene devices, the average temperature-dependent change in resistance was found to be small. These results are shown in FIG. 1. In addition, when the passivated graphene devices were retested after one week in a nitrogen-rich environment, 66 percent of devices exhibited less than 26 ohm variation from the week prior. The greater variation found for the remaining 34 percent of devices appears to have been due to incomplete passivation, as a consequence of the experimental nature of the setup. Thus, a higher yield is clearly expected for production stage passivated graphene devices according to embodiments of the present disclosure.

One of the greatest advantages for graphene as a PUF material choice has also been one of the biggest barriers to graphene implementation as a high-speed material—a large degree of device-to-device variation in measurable properties of the graphene (e.g., a resistance). The nature of this variation originates from many factors, such as graphene exposure to chemical processing used in device fabrication, domain boundaries inherent in the growth process and the presence of terrace edges in the case of silicon carbide (SiC)-grown graphene that cause mobility variations. The fact that graphene is often only one or two atomic layers thick greatly amplifies device-to-device variability. Embodiments of the present disclosure purposefully exploit the variability of different properties of graphene to provide an array of one or more PUF devices. In various embodiments, other processes and techniques, such as hydrogen intercalation, molecular doping, device length/width scaling, contact metal variation, contact treatments, and the like are intentionally implemented where further variations are required/desired. Thus, one embodiment may increase the variability by exposing one or more graphene layers to one or more varying ambient conditions during a manufacturing process.

Figure 4:
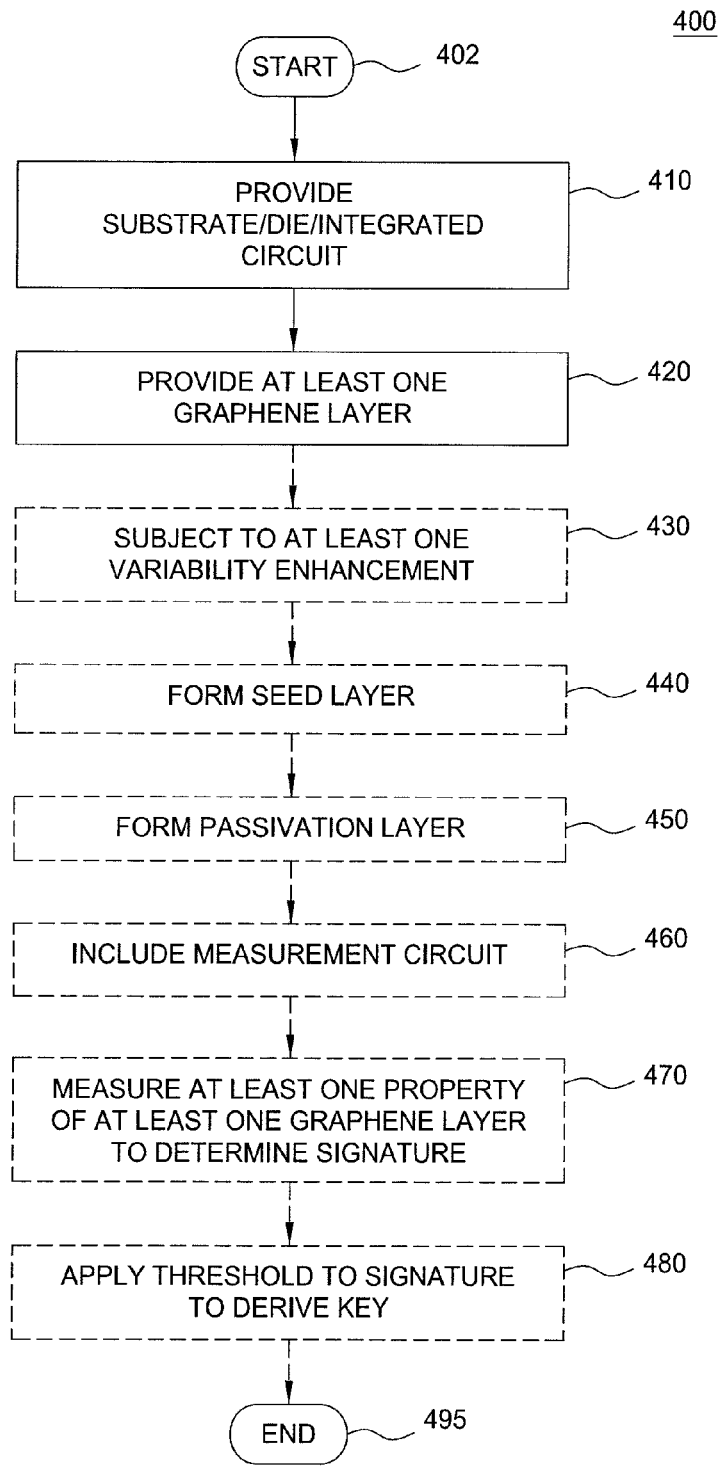
FIG. 4 is a flowchart of a method for manufacturing an exemplary device, according to embodiments of the present disclosure.

Referring back to FIG. 1, in one embodiment the average resistance of exemplary graphene devices (the average PUF value) was found to be approximately 430 ohms. In one embodiment, the average value is used as a cutoff or threshold between zeros and ones for a binary signature. It is desirable to have many devices with PUF values (e.g., resistance values) which are not near to the cutoff to avoid bit flips. For instance, device 28 in FIG. 4 is close to the cutoff of 430 ohms and may be categorized as a "zero", along with all other devices with resistances above the cutoff. However, changes in time, temperature and other conditions may cause the resistance of device 28 to vary. If the resistance drops for device 28, it may then be read as a "one". On the other hand, devices 13, 22 and 29, for example, exhibit desirable temperature stability and are far from the cutoff. Thus, the resistances of such devices are less likely to cross the threshold and to be involved in bit flips. Accordingly, in one embodiment variability-enhancing processes, such as those described above, yield graphene devices having a greater range variability in PUF values (e.g., resistance). In addition, in one embodiment, such graphene devices are passivated to provide stability, or to "lock-in" the wide range of PUF values.

In one embodiment, a graphene-based PUF is integrated with an integrated circuit (IC) chip as a back-end-of-line (BEOL) add-in or on a SiC (or Si/SiC) carrier chip attached to the IC for hardware authentication. In one embodiment, in the BEOL approach, graphene is transferred onto an IC to avoid impacting front-end-of-line (FEOL) device components. Several techniques for graphene transfer are available as are known to those skilled in the art. In another embodiment, graphene is directly grown on chip, e.g., epitaxially on a SiC substrate, via chemical vapor deposition (CVD), and so forth. For instance, graphene based PUF device(s) and related circuitry can be fabricated separately on a SiC or Si/SiC carrier chip and attached to the IC.

Figure 2:
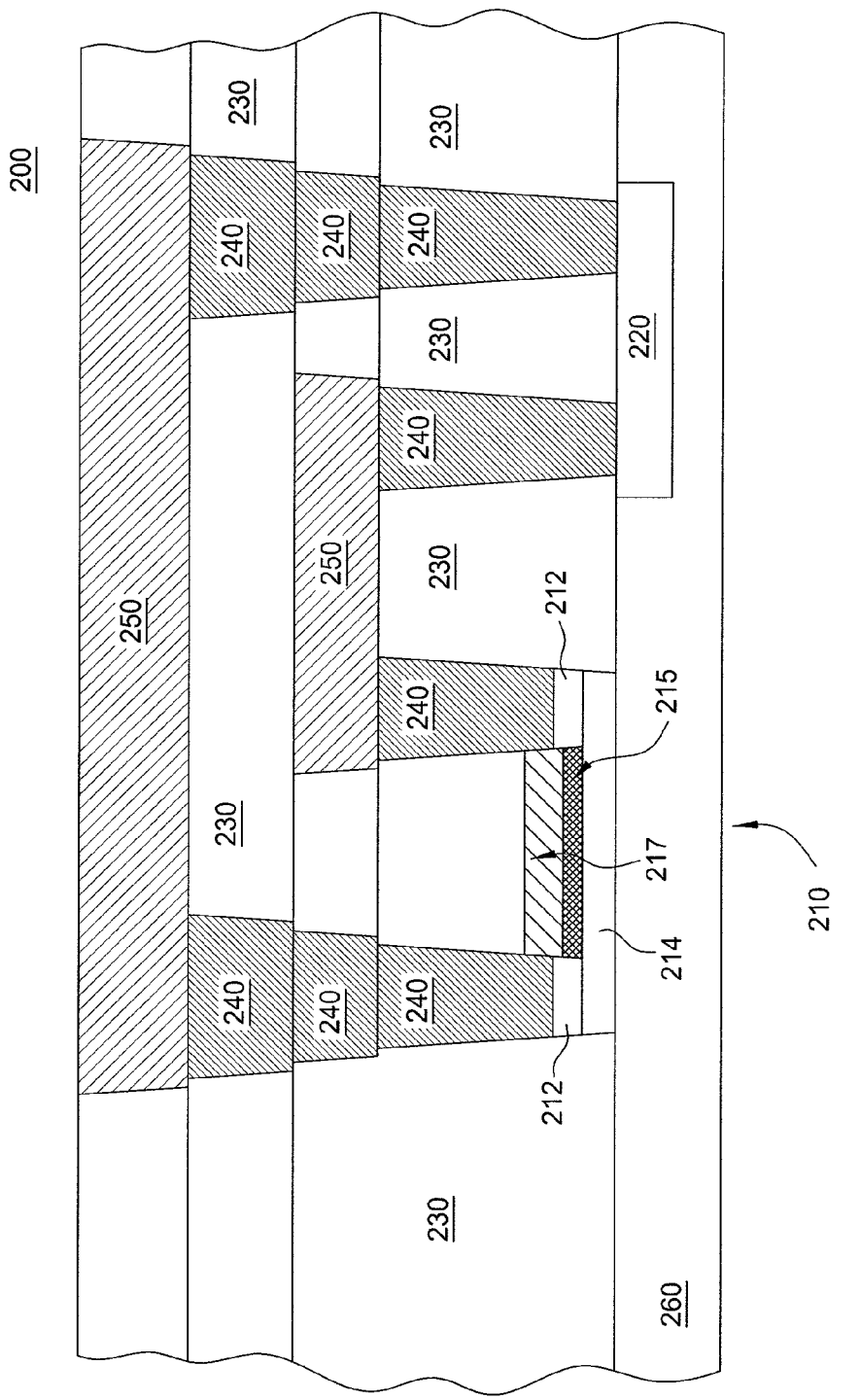
FIG. 2 illustrates an exemplary device, according to embodiments of the present disclosure.

To aid in understanding the present disclosure, FIG. 2 illustrates a cross-section of an exemplary device 200 (e.g., an integrated circuit) related to embodiments of the present disclosure. In particular, device 200 includes a substrate or die 260, which may be comprised of crystalline silicon (Si), germanium (Ge), SiGe, gallium arsenide (GaAs), or other semiconductors, as well as other materials for forming transistors, logic gates, resistors, capacitors and other structures. In one particular embodiment the substrate comprises silicon carbide (SiC). Although the example of FIG. 2 refers to a die 260, the present disclosure is not so limited. For example, the die may be one of many dies that may be formed from a common substrate. Thus, embodiments of the present disclosure may incorporate a substrate prior to separation of multiple dies. The die 260, which forms part of the front end of the integrated circuit, may have a number of structures provided thereon, e.g., formed or placed thereon, such as an array of one or more graphene devices, as well as a measurement circuit 220 which reads one or more physical properties of the graphene device(s) used for the PUF, as described in further detail below. As shown in FIG. 2, for ease of understanding there is one graphene device 210 comprising at least one graphene layer 214. In the embodiment of FIG. 2, the graphene device 210 comprises a resistor. In various other, further and different embodiments the graphene device may comprise any number of other similar structures, such as a capacitor, a transistor, a diode, and so forth, as well as more complex structures such as logic gates, and the like. Thus, the graphene device 210 is shown by way of example only, and not limitation. In any case, in one embodiment the graphene device 210 comprises source/drain electrodes 212 coupled via at least one graphene layer 214. In one embodiment, the graphene layer 214 may be grown on a substrate 260 (e.g., epitaxially on SiC using a temperature anneal to achieve thermal decomposition of the SiC and grow the graphene, by chemical vapor deposition (CVD) using a metal, such as nickel or copper, via a laser anneal on SiC, and so forth). In another embodiment, the graphene layer 214 is grown off-chip and physically transferred onto the substrate 260.

In one embodiment, the graphene device 210 may further include a seed layer 215 for the attachment or adhesion of a passivation layer 217. For example, the seed layer 215, or nucleation layer may comprise thermally or electron beam (e-beam) evaporated titanium (Ti) or aluminum (Al) for the attachment of a passivation layer 217. In one embodiment the titanium or aluminum is oxidized (e.g., $TiO_x$, $Al_2O_3$). In one embodiment, the seed layer 215 has a thickness of approximately six to twelve angstroms. In another embodiment, the seed layer 215 is formed by atomic layer deposition (ALD) and may comprise aluminum oxynitride (AlOxNy) or nitrous oxide ($NO_2$). In one embodiment, the ALD-formed seed layer is approximately one to two nanometers thick. In one embodiment, a temperature anneal is performed on the seed layer (e.g., at or above 300 degrees Celsius) prior to deposition of the passivation layer 217. Notably, a variety of materials adhere poorly to graphene. Thus, the presence of a seed layer 215 facilitates the use of a greater variety of materials in passivation layer 217 than would otherwise be possible. In addition, the seed layer 215 prevents interactions between the graphene layer 214 and the passivation layer 217, which could otherwise result in undesirable shifts in the electrical behavior (and hence the PUF value(s)) of the graphene).

In one embodiment, the passivation layer 217 is formed by way of an atomic layer deposition (ALD) process. In one embodiment, passivation layer 217 is approximately 10-20 nanometers thick, e.g., 15 nanometers. Notably, the passivation layer 217 may reduce or eliminate the impact of physisorbed molecules on the graphene layer 214 in order to improve stability of the measurable properties of the graphene layer 214 and/or graphene device 210. In one embodiment, the passivation layer 217 comprises a high-k dielectric material, such as hafnium oxide ($HfO_2$), aluminum oxide ($Al_2O_3$), tantalum oxide ($Ta_2O_5$) or titanium oxide ($TiO_2$). In a further embodiment, the passivation layer 217 comprises silicon nitride (e.g., $Si_3N_4$, or $SiN_x$), which may be deposited by chemical vapor deposition (CVD) or a plasma-enhanced CVD (PECVD). In another embodiment, the passivation layer 217 comprises a multilayer, or composite barrier. For example, the passivation layer 217 may comprise alternating layers of polyacrylate (polymer) films and inorganic oxides, forming a barrier to the diffusion of water and oxygen. Similarly, the passivation layer 217 may comprise a buffer layer of a low-k polymer, such as NFC 1400-3CP. For instance, the buffer layer may be applied over the graphene layer 214 and/or the seed layer 215. A high-k dielectric, such as hafnium oxide may then be formed over the buffer layer. Notably, the use of a low-k buffer layer enhances carrier mobility of the graphene, versus a direct graphene-dielectric interface. In still another embodiment, the passivation layer 217 comprises a poly-para-xylene polymer (also known as polyp-xylene), a family of materials often referenced by the trade name "parylene"). Poly(p-xylene) is a useful moisture and dielectric barrier, which is well suited for use in the passivation of graphene. Although Parylene C is the most popular, in one embodiment, passivation layer 217 comprises Parylene D, due to its superior performance as a diffusion barrier.

It should be noted that exemplary materials and fabrication processes have been described in connection with seed layer 215 and/or passivation layer 217. However, the present disclosure is not limited to only these examples. Thus, in other, further and different embodiments, one or more additional processes and/or materials may be used. For example, the processes for forming seed and/or passivation layers may be different for transferred graphene versus graphene that is grown epitaxially or via another technique, e.g., by CVD or laser anneal. Moreover, while the presence of seed layer 215 and passivation layer 217 confers various advantages, exemplary graphene devices of the present disclosure may nevertheless omit seed layer 215 and/or passivation layer 217 and still fall within the scope of the disclosure.

The backend of device 200 is a multi-layer interconnect structure which includes wiring for transporting signals between transistors in the front end and supply voltages, ground, and C4s (solder bumps), in the package. For example, the backend of a typical integrated circuit may include insulating materials, e.g., dielectric 230, which may comprise a low-k dielectric material such as borophosphosilicate glass or other low-k materials, and copper (Cu) or tungsten (Tu) wiring formed in vias 240 and traces 250. As shown in FIG. 2, the graphene device 210 is connected to measurement circuit 220 through wiring connections in the vias 240 and traces 250 in the backend interconnect structure.

According to various embodiments of the present disclosure, one or more graphene devices form the basis for a physical unclonable function. For example, in one embodiment, the measurement circuit 220 may read one or more physical properties of an array of one or more graphene devices in order to determine a signature of the physical unclonable function. In the example of FIG. 2, measurement circuit 220 is only shown as being connected to a single graphene device 210. However, it should be understood that in various embodiments, a measurement circuit may be connected to an array of two or more graphene devices, which collectively may be used as a PUF from which a signature may be derived for authenticating a device.

In one embodiment, the measurement circuit 220 may measure a PUF value from the graphene device 210 (e.g., a resistance). For example, in the embodiment of FIG. 2, the measurement circuit 220 may apply a known current and measure the voltage drop across the graphene device 210 to calculate a resistance according to Ohm's law. In various embodiments, different forms of on chip measurement circuits may be employed. For example, an on chip measurement device may comprise a voltage controlled ring oscillator, or sensing device as is described in U.S. patent application Ser. No. 12/032,100, filed Feb. 15, 2008 (Publication No. 2009/0206821 published Aug. 20, 2009), which is incorporated by reference herein in its entirety. As mentioned above, in one embodiment a physical unclonable function value may be based on the resistance of the graphene. However, the resistance need not be directly calculated. For instance, in response to the application of a specific and known current, the resistance of the graphene will result in a particular voltage (a voltage response), which can be used to drive a ring oscillator. In other words, the PUF value may be based upon the voltage response, without determining the underlying value of the resistance. It should be noted that in general, the specific form of the measurement circuits that may be used will depend upon the particular property of the graphene device(s) that are selected for use as a physical unclonable function (e.g., a resistance, a capacitance, and so forth). In any case, the measurable property, or the response of the graphene device 210 may be considered a signature of the graphene device 210 (in other words, a physical unclonable function).

Figure 3:
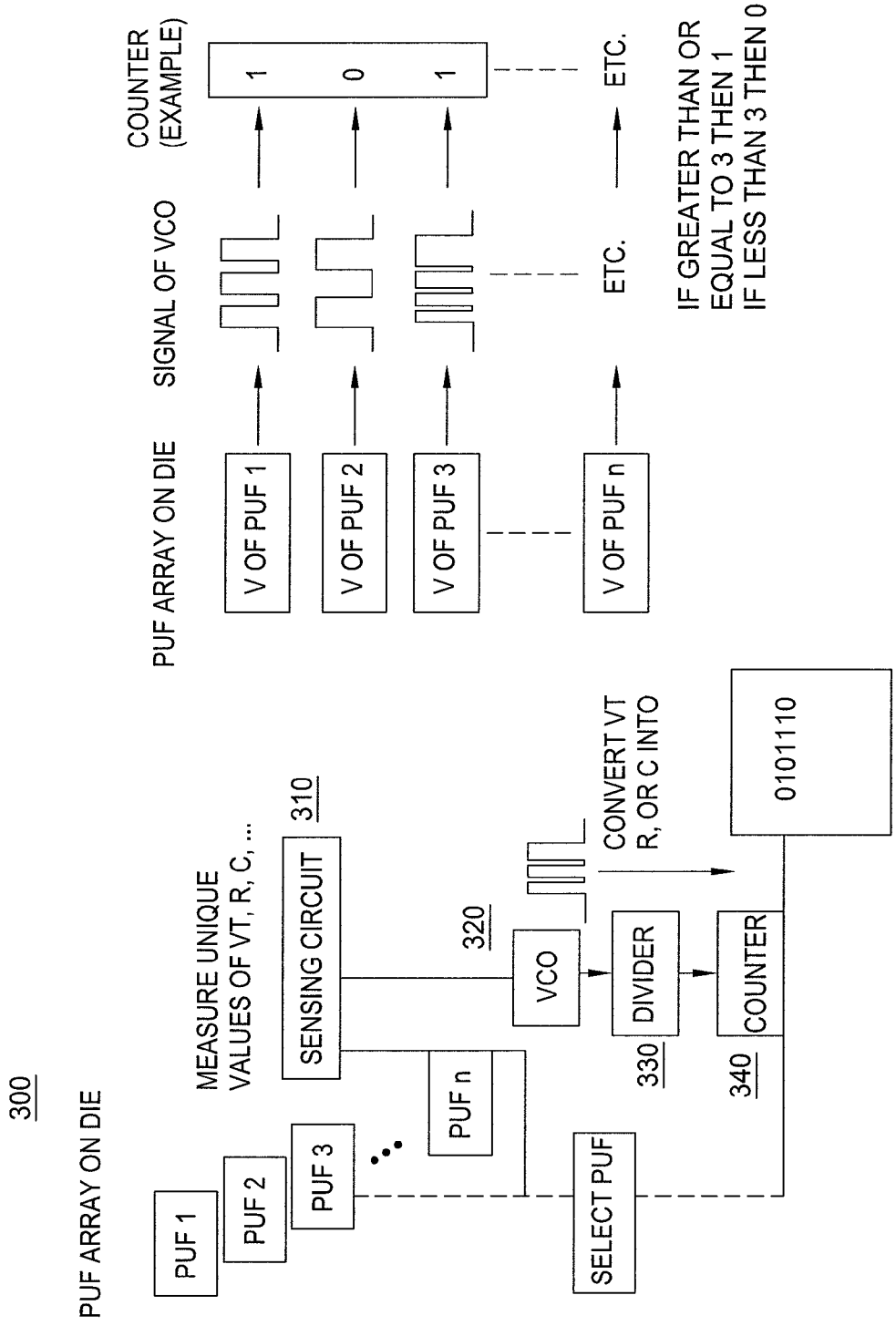
FIG. 3 illustrates the operation of an exemplary measurement circuit, according to embodiments of the present disclosure.

FIG. 3 depicts the operation of an exemplary measurement circuit (e.g., measurement circuit 220 in FIG. 2) according to various embodiments of the present disclosure. In particular, the embodiment of FIG. 3 may comprise an on chip measurement circuit (i.e., located within the integrated circuit itself, such as on a die of the integrated circuit) that is configured to measure a voltage response, resistance response, a capacitance response, etc. of one or more graphene devices formed on a substrate (or die/integrated circuit) comprising a physical unclonable function. As shown in the left side of FIG. 3, a measurement circuit 300 includes a sensing circuit 310, a voltage controlled oscillator 320, a divider 330 and a counter 340. In one embodiment, the sensing circuit 310 measures one or more graphene devices (e.g., PUF1, PUF2, PUF3 ... PUFn, as shown in FIG. 3). The response(s) of the one or more graphene devices are used by the sensing circuit to convert the PUF value(s) into a voltage value, or values, which will influence the oscillation frequency of the voltage controlled oscillator 320. In some embodiments, the output of the voltage controlled oscillator 320, which may be representative of the PUF value(s) of one or more graphene devices being measured, is received by the divider 330. The divider 330 and the counter 340 convert the signal of the voltage controlled oscillator that is influenced by the PUF value via the sensing circuit into a digital value, or binary representation. For example, the PUF value correlates to the period, or the number of cycles/oscillations in a given time, of the voltage controlled oscillator signal 320. The period is observed/determined by the counter 340 in order to decide if a particular PUF value should be categorized as a "1" or a "0". This process is repeated over one or more graphene devices to create a binary set. According to various embodiments, this binary set (also referred to herein as a code, or key), is used as a cryptographic key to authenticate a device. Notably, the code is never stored in binary form on the measurement device. It should also be noted that although a binary based key is described, the present disclosure is not so limited. Namely, other, further, and different embodiments may be incorporated in a ternary based system, and the like.

In the right side of FIG. 3, the responses of various individual graphene devices are represented by the PUF values V of PUF1, V of PUF2, etc., in the first column. The PUF values will influence, through the sensing circuit 310, the number of oscillation periods produced by the voltage controlled oscillator 320, which will then be counted by the counter 340 to determine the binary value. The threshold for distinguishing the binary values can be set by the counter 340 counting the oscillation periods.

It should be noted that when the PUF value (Vpuf) is close to a cutoff (e.g., 3), changes in temperature and changes over time may cause the PUF value to fluctuate and therefore cause a bit error in the binary key. Thus, the further the PUF value of a particular PUF device can be made away from the cutoff, the less likely it is that time and temperature changes will cause the PUF value to cross the threshold and switch from a zero to a one, or vice versa; hence, the more stable the binary key over time. Nevertheless, to account for PUF values which maybe close to the threshold, one embodiment may also include a temperature sensor and circuitry implementing a temperature compensation algorithm to account for variations in operating temperature of the device. For example, PUF values may vary with respect to temperature over a range of interest. Thus, the temperature compensation algorithm may account for predictable changes to the PUF values with respect to a stable temperature reference.

In addition, although one example of an on chip measurement circuit is depicted and described in connection with FIG. 3, in other, further and different embodiments a measurement circuit may be employed that takes various other forms. For example, a measurement circuit may be employed such as that described in Suh, et al., "Physical Unclonable Functions for Device Authentication and Secret Key Generation", Proceedings of the 44$^{th}$ Design Automation Conference, San Diego, Calif., June 2007, or U.S. patent application Ser. No. 12/032,100, filed Feb. 15, 2008 (Publication No. 2009/0206821 published Aug. 20, 2009), each of which is incorporated by reference herein in its entirety.

As mentioned above, in various embodiments, the variability in properties of graphene are purposefully increased from one graphene device to the next. In embodiments of the present disclosure, various techniques are used to achieve the variability. For example, in one embodiment, a laser anneal process involves the application of an excimer laser to a silicon carbide substrate which forms a sheet or one or more layers of graphene on the surface(s) to which the laser is applied. In order to increase the variability in measureable properties of the graphene, various conditions of the anneal can be varied. For example, the exciting laser wavelength, energy, beam width, pulse duration and other laser properties, as well as the duration of the anneal, can all be varied (e.g., from one graphene device to the next).

In one embodiment, graphene devices are fabricated using electron beam lithography to ensure small geometrical device-to-device variability (to avoid attackers "guessing" PUF values based upon differing dimensions). However, in other embodiments, variability of one or more components of the graphene device may further be achieved through patterning processes, including lithography. For example, aspects of these processes can be varied (e.g., purposefully and/or randomly) from the manufacture of one graphene device to the next. For instance, geometric variability through lithography will result in graphene sheets of different dimensions, which will likely exhibit varied and different resistance values, capacitance values, and so forth. Similarly, contact metal variation, contact treatment and the like may also be employed to enhance variability of a graphene device. For example, copper contacts are commonly used in the backend. However, other metals, such as nickel and palladium, with higher contact resistances have a naturally greater variation and would give rise to greater variability in the range of measured PUF values. Similarly, in one embodiment the contact areas may be subjected to a plasma treatment and/or an anneal to create disorder and further enhance variability.

In still other embodiments, variability is increased by exposing or subjecting the graphene to various ambient conditions during a manufacturing process, such as purposefully varying the quantities of available dopant, the types of dopant, the ambient temperature, ambient oxygen levels, and the like. For example, in one embodiment the graphene is formed in the presence of hydrogen to effect hydrogen intercalation. The quantity of hydrogen, the duration of the exposure, the ambient temperature during exposure to hydrogen, and so forth can be varied from one graphene device to the next, resulting in full, partial or no intercalation. In general, intercalation decouples the graphene layer(s) from the SiC substrate. However, less than full decoupling will result in a greater range of electrical properties of graphene from device to device. In another embodiment, graphene is formed in the presence of ozone or perylene tetracarboxylic acid. For example, ozone is physisorbed on the surface of graphene to form nucleation sites for dielectric deposition. By varying the quantity of ozone, the duration of ozone exposure, and other conditions, further variability of graphene devices can be achieved. In one embodiment, an ozone or oxygen plasma treatment creates disorder and flaking of the graphene in a substantially random way, thereby increasing variability.

In some embodiments, for example in a large array, the location(s) of the graphene devices that are included in the PUF array can be varied, purposefully and/or randomly or otherwise, so that from one device to the next, the location(s) of the PUF are not necessarily the same. Thus, an attacker may not know where to look for a PUF signature going from chip to chip, increasing the difficulty of an attacker's task many-fold. However, in another embodiment, the locations of the graphene devices are not varied from one device to the next (to prevent attackers "guessing" which portions of the device are graphene-based PUF devices). In any case, any one of the above techniques, or a combination thereof, result in a wide range of purposeful variations, which may be substantially random, in the physical and electrical properties of the graphene. This range of variations can be exploited in measuring one or more properties of the graphene device when used as a physical unclonable function, resulting in more stable keys derived therefrom, and thus less bit errors. In particular, when creating purposeful variation in an array of multiple graphene devices, substantially unique signatures may be derived therefrom.

In addition, in various embodiments a measurement circuit is included on chip (i.e., on or in the same die/substrate as the graphene devices it is measuring). By placing the measurement circuit on chip, it makes it more difficult to probe and access the PUF than where the measurement circuit is not part of the same IC. For example, to access the PUF (i.e., the one or more graphene devices) through delayering, the attacker will need to delayer the measurement circuit in addition to the graphene devices(s) themselves. This makes it more likely that the attacker will destroy either one or more of the graphene devices or the measurement circuit. However, the device will not function without both the gate structure(s) and the measurement circuit which derives the signature therefrom. Without the functioning measurement circuit, the attacker will not know how to convert the PUF value(s) to a binary signature. In addition, if the attacker tries to access the array of one or more graphene devices directly (e.g., through probing) it will inevitably alter the physical properties of one or more components sufficiently enough (e.g., due to exposure to air, light/radiation, etc.) to change the signature and key, thereby rendering the device useless. In other words, to see the measurement circuit or PUF, it is likely that one or the other, or both, will be destroyed in the attack. Accordingly, such embodiments of the present disclosure provide a tamper response. In other words, if an attacker tries to gain physical access to a PUF signature/key by delayering, probing, imaging or other established failure analysis methods, the PUF and/or measurement circuit is altered or even destroyed in such a way as to prevent regeneration of the key. In particular, experimental results show that graphene is particularly susceptible to techniques involving radiation (e.g., tunneling electron microscopy (TEM), scanning electron microscopy (SEM), x-ray, etc.).

For example, a set of graphene devices having an average total resistance of approximately 430 ohms exhibited stability (in resistance value) after exposure to 28 degree Celsius temperature for one week. However, several of the stable graphene devices were subjected to SEM (e.g., using an accelerating voltage of one kiloelectron volt and 5,000 times magnification). The resistances dropped 100 to 300 ohms or more. Such changes in the resistance (as well as other measurable properties) of the graphene, thereby change the signature and indicate that the device has been tampered with.

FIG. 4 illustrates a flowchart of a method 400 for creating a secure device having a physical unclonable function. In particular, exemplary steps of the method 400 may be performed in accordance with the above described embodiments.

The method 400 begins at step 402 and proceeds to step 410 where the method provides a substrate/die. For example, a substrate/die may be the basis for one or more integrated circuits, each of which may comprise a front end layer of semiconducting silicon, gallium arsenide, germanium and the like, along with other materials and/or combinations thereof, and having formed therein a number of transistors, gates, nets, and the like. The integrated circuit may also comprise a number of backend layers including a dielectric (e.g., a low-k dielectric) or other insulating materials, vias, traces, and wiring connecting various elements in the front end to each other, to ground, and to power sources, among other things. An exemplary integrated circuit is illustrated in FIG. 1 and described above. In one embodiment, the substrate comprises silicon carbide (SiC).

At step 420, the method 400 provides at least one graphene layer (or graphene device) on the substrate. For example, the graphene layer may be formed on a silicon carbide substrate (e.g., by epitaxial growth, via CVD or via other techniques known in the art). In another embodiment, the graphene layer may be formed elsewhere (e.g., in an aqueous solution) and transferred to the substrate. The foregoing are given by way of example only and not limitation. Thus, any technique for forming one or more layers of graphene are suitable for implementation at step 420. The at least one graphene layer and/or other components of a graphene device may be deposited in structures or on planar substrate formed by well known etching techniques. In addition, the at least one graphene layer may be formed in either a gate-first process or a gate-last process, as is known to those skilled in the art. Accordingly, in some embodiments the at least one graphene layer is provided at the same time the given layer of an IC is fabricated, before adding any additional layers (e.g., backend layers, protective layers, etc.).

In various embodiments, the at least one graphene layer added at step 420 is used as a physical unclonable function. For example, a measurement circuit can determine various physical properties of the at least one graphene layer and derive a signature and key therefrom. Accordingly, in some cases, steps 430-480 of the method 400 are performed following step 420. However, not all of these steps need be performed in an exemplary process for forming a secure device in accordance with the method 400. Thus, in some embodiments, following step 420 the method 400 proceeds to step 495, where the method ends. However, in some embodiments, the method 400 proceeds to step 430.

At step 430, the method 400 subjects the at least one graphene layer to one or more variability enhancements. For example, the method 400 may expose the at least one graphene layer to various quantities of one or more dopants or contaminants, such as ozone, PTCA, and the like, which may adsorb to or be physisorbed by the at least one graphene layer. In addition, at step 430 the method 400 may further vary such things as the ambient temperature, oxygen levels, hydrogen levels, ozone levels and the like during a fabrication of the at least one graphene layer/graphene device. In one embodiment, at step 430, the method may also perform one or more patterning processes on the at least one graphene layer, the contacts/electrodes connected by the at least one graphene layer, the substrate, and/or other components of the graphene device. For example, a lithography process, reactive ion etching, chemical mechanical planarization, or one or more other CMOS (complementary metal oxide semiconductor) processing techniques may be employed to create specific dimensions (e.g., length and width) of the at least one graphene layer, the size of the contacts and so forth. More specifically, parameters for the performance of each of these processes can be varied from manufacturing one graphene device to the next, providing further variability between the different graphene devices used for a PUF.

In one embodiment, the at least one graphene layer may be fabricated with channel lengths tuned to coincide with a length just smaller that the average size of graphene domain boundaries. Thus, in a set of graphene devices, each device will include either no domain boundaries or one boundary. This enhances the bimodal distribution of PUF values (e.g., resistances, voltage responses, etc.) and helps to create a more clear separation of 0's and 1's in the cryptographic key. In this regard, it should also be noted that the at least one graphene layer may purposefully comprise two layers, three layers, etc. In particular, the more layers in a single graphene device, the greater likelihood that a domain boundary will exist in the graphene somewhere between the source and drain. This leads to further variability in the electrical properties of the graphene, and hence greater variability in the underlying PUF values.

In one embodiment, where a laser anneal is performed to create the graphene layer, step 430 may modify various laser properties during the anneal, including beam width, wavelength, pulse duration, and the like, which leads to much variability in the properties of the at least one graphene layer (and hence the resulting graphene device). In some embodiments, parameters of the laser anneal are varied from one graphene device to the next when fabricating an array of such devices for use as a PUF. For instance, the line width, beam energy and other factors can all be varied in performing anneals on different graphene devices. Further, in some cases the laser anneal is applied to the underlying substrate, or even other layers, in the same manner as described above. This similarly leads to variations is different properties of the affected material (e.g., the underlying substrate) such as changes in the resistivity, and the like. In turn, this affects the variability in the measurable properties (e.g., the PUF value(s)) of a resulting graphene device.

In various embodiments, the variability enhancements of step 430 are applied at the same time the at least one graphene layer is provided at step 420 and/or at any other time during a fabrication process of a graphene device including the at least one graphene layer. For example, the oxygen level may be varied at the same time as performing a laser anneal on the substrate to create the at least one graphene layer.

At step 440, the method 400 forms a seed layer. For example, a seed layer may be deposited or grown on the at least one graphene layer, as described in detail above. In one embodiment, the method 400 forms the seed layer, or nucleation layer by thermal or electron beam (e-beam) evaporation. In another embodiment, step 440 forms the seed layer by atomic layer deposition (ALD). In one embodiment, a temperature anneal is performed on the seed layer at step 440 (e.g., at or above 300 degrees Celsius) prior to proceeding to step 450 for the forming of a passivation layer.

At step 450, the method 400 forms a passivation layer. For example, a passivation layer may be deposited or grown on the seed layer and/or directly on the at least one graphene layer, as described in detail above. For instance, in one embodiment the method 400 forms the passivation layer, e.g., hafnium oxide ($HfO_2$), aluminum oxide ($Al_2O_3$), tantalum oxide ($Ta_2O_5$) or titanium oxide ($TiO_2$), by way of an atomic layer deposition (ALD) process. In a further embodiment, the passivation layer, e.g., silicon nitride (e.g., $Si_3N_4$, or $SiN_x$) is deposited by chemical vapor deposition (CVD) or a plasma-enhanced CVD (PECVD). In another embodiment, the passivation layer formed at step 450 comprises a multilayer, or composite barrier. For example, the passivation layer may comprise alternating layers of polyacrylate (polymer) films and inorganic oxides. Similarly, the passivation layer may comprise a buffer layer of a low-k polymer, such as NFC 1400-3CP, a poly-para-xylene polymer, and so forth.

In some embodiments, the method 400 proceeds to step 460 where the method includes a measurement circuit on the substrate/die provided at step 410. Exemplary measurement circuits are described above in connection with FIGS. 2 and 3.

In some embodiments, following step 460 the method 400 proceeds to step 470 where the method measures at least one physical property of the at least one graphene layer to determine a signature. The measurements may be performed using the measurement circuit added at step 460. Specifically, in some embodiments, the measurement circuit is configured to measure/detect various properties of the at least one graphene layer as described above in connection with the exemplary measurement circuit 300 in FIG. 3 or 220 in FIG. 2. For instance, the method 400 may measure the voltage response, resistance, capacitance, inductance, and other properties of the at least one graphene device provided at step 420 in order to derive a signature therefrom. The signature may comprise one or more analog values reflecting the responses of each of the one or more graphene devices to one or more applied signals.

Following step 470, the method 400 may further proceed to step 480 where the method applies a threshold to the signature to derive a key. For example, as mentioned above, the signature of the at least one graphene layer added at step 420 may comprise one or more analog waveforms representing the response(s) of the one or more graphene devices to applied signals. Accordingly, in one embodiment the method 400 derives a signature by using a counter to count the oscillations/period of the voltage controlled oscillator signal, or similar means. In another embodiment, the method 400 determines a resistance at step 470 by applying a known current to the at least one graphene layer and measuring the voltage across the at least one graphene layer. In addition, a threshold may be applied, such as shown in the examples of FIGS. 1 and 3, to derive a binary representation. In various embodiments, the set of binary representations that is output forms a key for the integrated circuit which may be used for cryptographic and authentication purposes, among other things. For instance, the key may be stored in random access memory (RAM). Thereafter, a processor may access the key from the RAM in order to perform various computations. Since RAM is volatile, when the device's power is shut off, the key is automatically erased from the RAM. Every time the device/chip is turned on, the key needs to be regenerated (e.g., by way of the method 400). It should be noted that although a binary based key is described, the present disclosure is not so limited. Namely, other, further, and different embodiments may be incorporated in a ternary based system, and the like.

At step 495, the method 400 ends. Accordingly, the steps of the method 400 produce a secure device comprising an integrated circuit having a physical unclonable function (in the form of one or more graphene layers/graphene devices which may be subject to one or more variability enhancements). In some embodiments, the secure device includes a measurement circuit for purposes of extracting a key from the properties of one or more graphene devices that can be used for cryptographic and authentication purposes.

Although particular embodiments have been described above in connection with the method 400 above, it should be noted that other embodiments of the present disclosure are no so limited. For instance, although the method 400 has been described in connection with certain exemplary materials, the method 400 is presented by way of example only and not limitation. Thus, in other, further and different embodiments, the method 400 may use alternative materials suitable for use a substrate, contact/electrode metals or other materials, and other components. Moreover, although the steps of the method 400 are listed in a particular order, as shown in FIG. 4, it should be noted that alternate embodiments of the present disclosure may implement these steps in a different order. In addition, although the above description sometimes refers to a single graphene device, embodiments of the present disclosure specifically contemplate cryptographic keys based upon multiple graphene devices. Thus, in one embodiment a first graphene layer (of a first graphene device) and the second graphene layer (of a second graphene device) are subjected to variability enhancements such that the first graphene layer and the second graphene layer each have different values for a measurable property for authenticating the secure device.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents. In addition, although various embodiments which incorporate the teachings of the present disclosure have been shown and described in detail herein, those skilled in the art can readily devise many other varied embodiments that still incorporate these teachings.

What is claimed is:

1. A secure device having a physical unclonable function, the secure device comprising:
   at least one graphene layer, wherein the at least one graphene layer comprises the physical unclonable function; and
   a measurement circuit, wherein the measurement circuit is configured to measure at least one property of the at least one graphene layer for authenticating the secure device.

2. The secure device of claim 1, further comprising:
   a seed layer.

3. The secure device of claim 2, wherein the seed layer comprises aluminum oxynitride or nitrogen dioxide.

4. The secure device of claim 2, wherein the seed layer is formed by atomic layer deposition.

5. The secure device of claim 2, wherein the seed layer comprises:
   titanium oxide or aluminum oxide for adhesion of a passivation layer.

6. The secure device of claim 5, wherein the titanium oxide or aluminum oxide comprises thermally evaporated or electron beam evaporated titanium or aluminum.

7. The secure device of claim 1, further comprising:
   a passivation layer.

8. The secure device of claim 7, wherein the passivation layer is formed by atomic layer deposition.

9. The secure device of claim 7, wherein the passivation layer comprises silicon nitride.

10. The secure device of claim 7, wherein the passivation layer is formed by chemical vapor deposition.

11. The secure device of claim 7, wherein the passivation layer comprises a multilayer, the multilayer comprising at least one layer of a polyacrylate film and at least one layer of an inorganic oxide.

12. The secure device of claim 7, wherein the passivation layer comprises a poly-para-xylene polymer.

13. The secure device of claim 7, wherein the passivation layer comprises a high-k dielectric.

14. The secure device of claim 13, wherein the high-k dielectric comprises at least one of:
   hafnium oxide;
   aluminum oxide;
   tantalum oxide; or
   titanium dioxide.

15. The secure device of claim 1, further comprising:
   a buffer layer comprising a low-k polymer.

16. The secure device of claim 1, wherein the at least one layer of graphene has been subjected to a variability enhancement comprising at least one of:
   an exposure to ozone; or
   an exposure to perylene tetracarboxylic acid.

17. The secure device of claim 1, further comprising:
   a source electrode; and
   a drain electrode, wherein the at least one graphene layer is located between the source electrode and the drain electrode.

18. The secure device of claim 1, wherein the measurement circuit is configured to derive a signature having one or more physical unclonable function values from the at least one property.

19. The secure device of claim 18, wherein the measurement circuit is further configured to derive a binary key from the signature, wherein the binary key is derived from the signature via the measurement circuit by applying a threshold to the one or more physical unclonable function values.

20. The secure device of claim 1, wherein the at least one property of the at least one layer of graphene that is measured by the measurement circuit comprises at least one of:
   a resistance;
   a capacitance;
   an impedance;
   an inductance;
   a transmittance; or
   a voltage response.

* * * * *